(12) United States Patent
Ding et al.

(10) Patent No.: US 11,538,746 B2
(45) Date of Patent: Dec. 27, 2022

(54) VERTICAL BOND-WIRE STACKED CHIP-SCALE PACKAGE WITH APPLICATION-SPECIFIC INTEGRATED CIRCUIT DIE ON STACK, AND METHODS OF MAKING SAME

(71) Applicant: Intel Corporation, Santa Clara, CA (US)

(72) Inventors: Zhicheng Ding, Shanghai (CN); Yong She, Songjiang (CN); Bin Liu, Shanghai (CN); Aiping Tan, Shanghai (CN); Li Deng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 383 days.

(21) Appl. No.: 16/349,095

(22) PCT Filed: Dec. 23, 2016

(86) PCT No.: PCT/CN2016/111785
§ 371 (c)(1),
(2) Date: May 10, 2019

(87) PCT Pub. No.: WO2018/112914
PCT Pub. Date: Jun. 28, 2018

(65) Prior Publication Data
US 2019/0273037 A1    Sep. 5, 2019

(51) Int. Cl.
*H01L 23/00* (2006.01)
*H01L 23/498* (2006.01)
(Continued)

(52) U.S. Cl.
CPC .... *H01L 23/49816* (2013.01); *H01L 23/5389* (2013.01); *H01L 24/42* (2013.01);
(Continued)

(58) Field of Classification Search
CPC .......... H01L 23/49816; H01L 23/5389; H01L 24/42; H01L 24/49; H01L 25/065; H01L 25/0657
See application file for complete search history.

(56) References Cited

U.S. PATENT DOCUMENTS 9,627,358 B2 *  4/2017  Zhao ................ H01L 24/19
10,636,773 B2 *  4/2020  Kuo ................. H01L 21/6835
(Continued)

FOREIGN PATENT DOCUMENTS

CN    110050340         11/2021
WO    WO-2016049940 A1  4/2016
WO    WO-2018112914 A1  6/2018

OTHER PUBLICATIONS

"Chinese Application Serial No. 201680091054.0, Office Action dated Feb. 23, 2021", w English Translation, 11 pgs.
(Continued)

*Primary Examiner* — Mounir S Amer
*Assistant Examiner* — Alexander Belousov
(74) *Attorney, Agent, or Firm* — Schwegman Lundberg & Woessner, P.A.

(57) ABSTRACT

A system in package includes a memory-die stack in memory module that is stacked vertically with respect to a processor die. Each memory die in the memory-die stack includes a vertical bond wire that emerges from a matrix for connection. Some configurations include the vertical bond wire emerging orthogonally beginning from a bond-wire pad. The matrix encloses the memory-die stack, the spacer, and at least a portion of the processor die.

17 Claims, 7 Drawing Sheets

(51) Int. Cl.
  *H01L 23/538* (2006.01)
  *H01L 25/065* (2006.01)
  *H01L 23/31* (2006.01)
(52) U.S. Cl.
  CPC ............ *H01L 24/49* (2013.01); *H01L 25/065* (2013.01); *H01L 25/0657* (2013.01); *H01L 23/3128* (2013.01); *H01L 2224/12105* (2013.01); *H01L 2224/32145* (2013.01)

(56) References Cited

U.S. PATENT DOCUMENTS

2010/0193930 A1* 8/2010 Lee .................... H01L 23/5389
                                                        257/686
2012/0056178 A1    3/2012 Han et al.
2015/0325496 A1* 11/2015 Alvarado ............... H01L 21/56
                                                        257/774

OTHER PUBLICATIONS

"International Application Serial No. PCT/CN2016/0111785, International Search Report dated Sep. 27, 2017", 7 pgs.
"International Application Serial No. PCT/CN2016/0111785, Written Opinion dated Sep. 27, 2017", 4 pgs.
"Chinese Application Serial No. 201680091054.0, Response filed Jul. 8, 2021 to Office Action dated Feb. 23, 2021", With English claims, 35 pages.

* cited by examiner

VERTICAL BOND-WIRE STACKED CHIP-SCALE PACKAGE WITH APPLICATION-SPECIFIC INTEGRATED CIRCUIT DIE ON STACK, AND METHODS OF MAKING SAME

PRIORITY APPLICATION

This patent application is a U.S. National Stage Application under 35 U.S.C. 371 from International Application No. PCT/CN2016/111785, filed Dec. 23, 2016, published as WO 2018/112914, which is incorporated herein by reference in its entirety.

FIELD

This disclosure relates to a memory-die stack with vertical bond wires. The memory-die stack is part of a chip-scale packaging memory module. The memory module is configured as a system-in-package (SiP) device including processing, memory, and application-specific integrated circuit devices in memory module.

BACKGROUND

Computing devices such as mobile telephones, smart phones and tablet computers are restricted in available space because there are size limitations dictated by intended use. Size reduction presents challenges for packaging.

BRIEF DESCRIPTION OF THE DRAWINGS

Various disclosed embodiments of are illustrated by way of example, and not by way of limitation, in the figures of the accompanying drawings and in which.

DETAILED DESCRIPTION

A memory-die stack is used in a memory module by pinning out the memory-die stack with vertical bond wires that breach a matrix at a landing surface. In an embodiment, the memory-die stack includes DRAM memory. In an embodiment, the memory-die stack includes SRAM memory. In an embodiment, the memory-die stack includes cross-point memory developed by Intel Corporation of Santa Clara, Calif. In an embodiment, the memory module is a solid-state drive. In an embodiment, the memory module is used for mass storage. In an embodiment, the memory module is used as a system in package apparatus.

Figure 1:
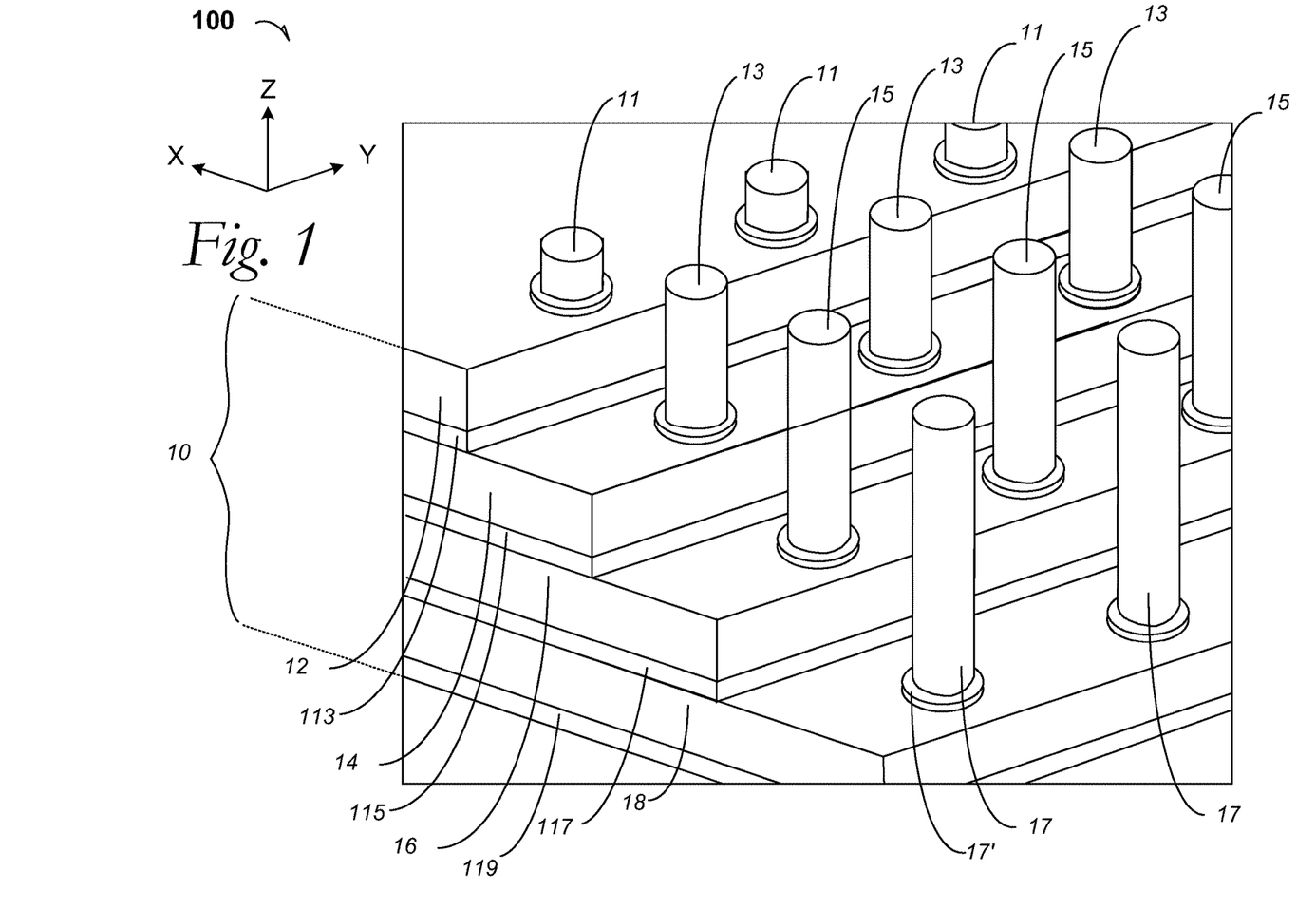
FIG. 1 is a perspective elevation detail of a portion of a memory-die stack with orthogonal wire bonds according to an embodiment.

FIG. 1 is a perspective elevation detail 100 of a portion of a memory-die stack 10 with orthogonal wire bonds 11, 13, 15 and 17 according to an embodiment. Each wire bond when it is bonded originating at a bond pad (not pictured), forms a bond-wire bead. A bond-wire bead 17' is illustrated.

The memory-die stack 10 is part of a memory module 110 (see, e.g., FIG. 1A) according to an embodiment. The memory module 110 includes the memory-die stack 10 and at least one other active device such as a processor. As depicted, the memory-die stack 10 shows first- second- third- and fourth memory dice 12, 14, 16 and 18 that are stacked in the Z-direction and are constructed in an X-direction stair-step configuration. The memory module 10 is assembled using an adhesion first film 113 an adhesion second film 115 and an adhesion third film 117. In an embodiment, subsequent adhesive layer 119 may be used to stabilize the memory module 10 during stack assembly. Other functionalities for memory module embodiments are disclosed.

It can be seen that a series of orthogonal first memory-die bond wires 11 are configured serially in the Y-direction on the first memory die 12 and they extend from the first memory die 12. Similarly, a series of orthogonal second memory-die bond wires 13 are configured on the second memory die 14. Likewise, a series of orthogonal third memory-die bond wires 15 are configured on the third memory die 16. And similarly, a series of orthogonal subsequent memory-die bond wires 17 are configured on the subsequent memory die 18. Construction of the series of orthogonal memory die bond wires is illustrated and described in this disclosure.

Figure 1A:
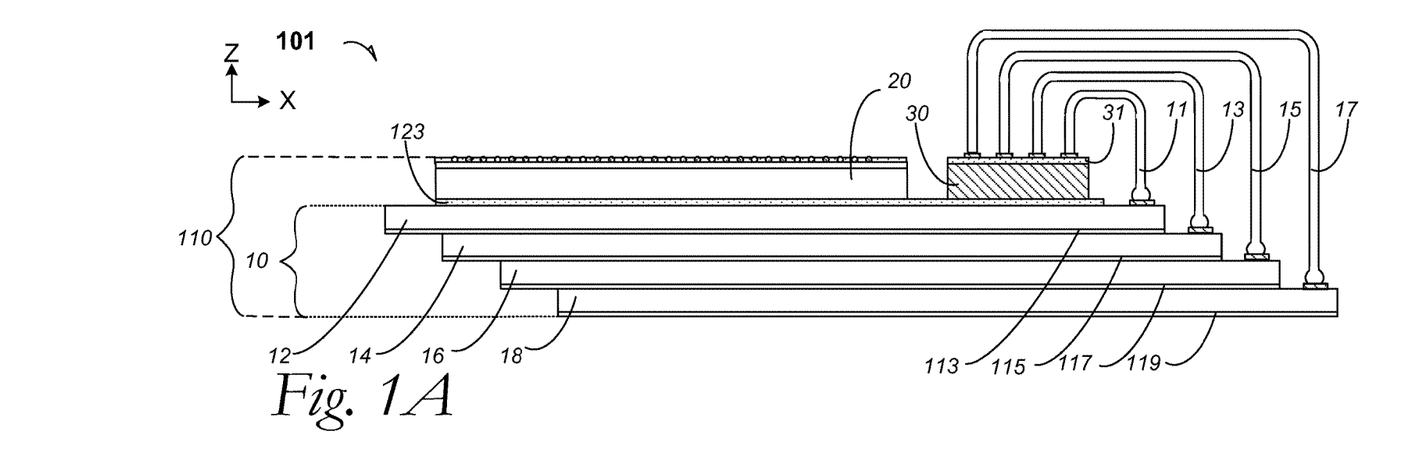
FIG. 1A is a cross-section elevation of a memory module that includes a memory-die stack with orthogonal bond wires according to a processing embodiment.

FIG. 1A is a cross-section elevation 101 of a memory module 110 that includes a memory-die stack 10 with orthogonal bond wires 11, 13, 15 and 17 according to a processing embodiment. During processing, the memory module 110 is being configured for a chip-scale package apparatus. Reference to FIG. 1 for the memory-die stack 10 is useful.

During processing, the memory module 110 includes an additional device functionality such as being assembled with a processor first die 20. In an embodiment, a spacer 30 is also assembled with the processor first die 20 such as by adhering at an adhesive processor-die film 123. In an embodiment, the processor first die 20 has the functionality of an application-specific integrated circuit (ASIC) such as a memory controller. In an embodiment, the spacer 30 is electronics-grade aluminum. Similar to the memory-die stack 10 depicted in FIG. 1, the memory-die stack 10 includes a subsequent memory die 18, as well as a subsequent adhesive layer 119 that may be used to stabilize the memory-die stack 10 during stack assembly.

In an embodiment, the spacer 30 may actually be an active device such as a memory controller hub 30 and an adhesive 31 is sufficiently robust to cover pre-attached bumps (see bumps 132 depicted in FIG. 1C) such that the spacer 30 temporarily accommodates the loop-anchored bond wires upon the adhesive 31, but the bumps 132) are later exposed similar to the bump array 122 on the processor first die 20. By this terminology, the spacer 30 may be a second die 30 that is robustly protected by the adhesive 31 until exposure of the bumps 132 is useful. In an embodiment, the spacer 30 is a passive device such as a balun 30 that may be pre-bumped 132 below the adhesive 31.

It can be seen that respective vertical first- second- third- and subsequent memory-die bond wires 11, 13, 15 and 17 are anchored at their respective memory dice 12, 14, 16 and 18, but they are also vertically wire-loop anchored to the spacer 30. The spacer 30 is used to stabilize and to position the loop-anchored vertical bond wires 11, 13, 15 and 17 during the assembly of the memory-die stack 10 and the first processor die 20. In an embodiment, the spacer 30 is an aluminum material or some other material that is sufficiently rigid during assembly to provide strengthened loop-anchored wires 11, 13, 15 and 17. In an embodiment, the bond wires are looped onto the spacer 30 and attached at an adhesive 31 such as a dielectric material. The adhesive 31 may be configured to release by thermal-release processing, or it may be dissolved after backgrinding of molding matrix as will be further illustrated.

Figure 1B:
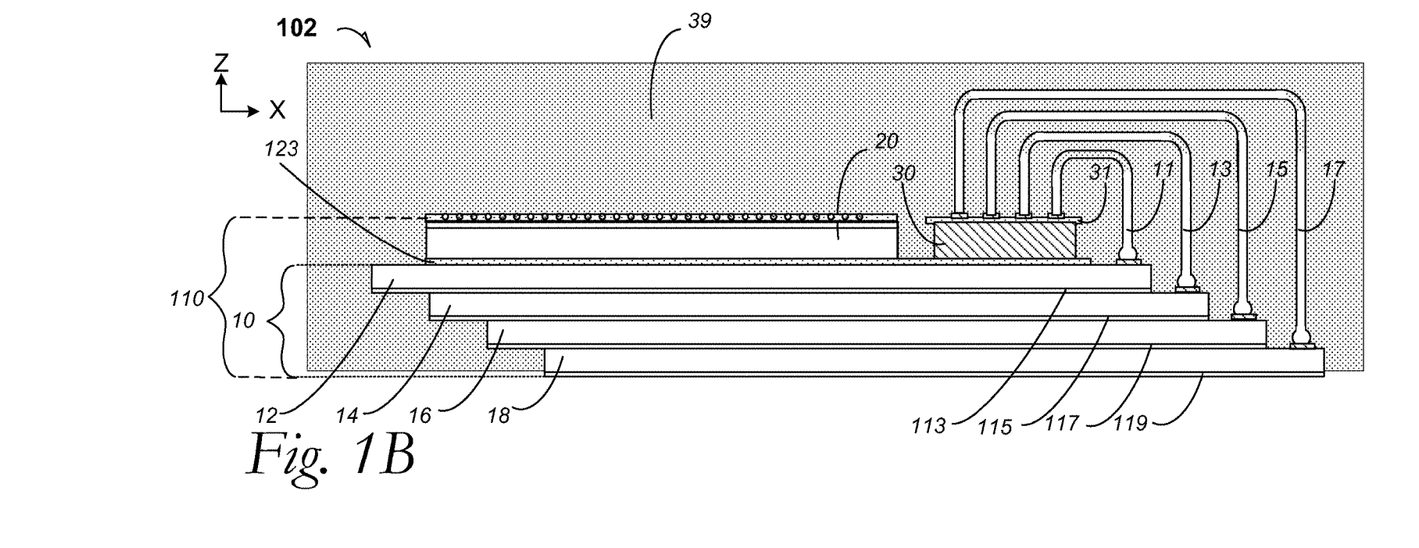
FIG. 1B is a cross-section elevation of the memory module depicted in FIG. 1A after further processing according to an embodiment.

FIG. 1B is a cross-section elevation 102 of the memory module 110 depicted in FIG. 1A after further processing according to an embodiment. A matrix precursor 39 has been formed over the memory module 110, including the memory-die stack 10 and the processor first die 20 as well as over the spacer 30. The loop-anchored vertical bond wires 11, 13, 15 and 17 are also affixed in the matrix precursor 39, but movement of the vertical portions is resisted by their loop-anchored configuration at each bond wire origination on each respective die, as well as at the spacer 30. The loop-anchored bond wires may be variously bent for attachment to the memory dice in the memory-die stack 10 and to the spacer 30 to facilitate few shorts, or no shorting between bond wires during assembly. As illustrated, the bond wires extend orthogonally from their respective dice according to an embodiment.

In an embodiment, the matrix precursor 39 is assembled to the various structures. In an embodiment, selected spray depositing of matrix precursor 39 is first done to fill into spaces that may be too tight for useful bulk overmolding conditions (such as at the bond wires), followed by injection molding of more matrix precursor material 39.

Figure 1C:
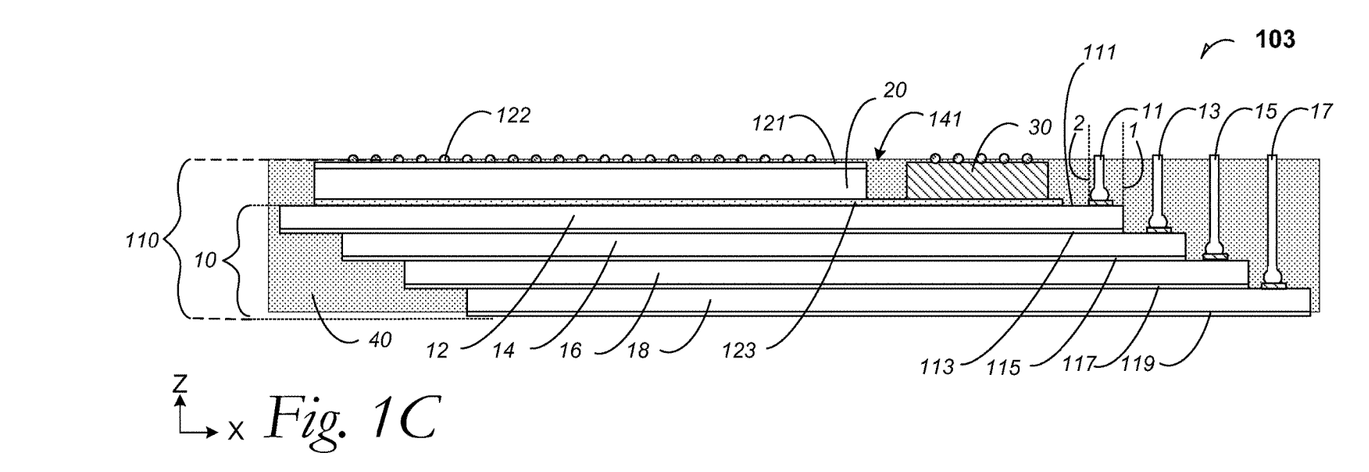
FIG. 1C is a cross-section elevation of memory module that is part of a system in package apparatus that uses orthogonal wire bond technology that includes a processor die according to an embodiment.
Figure 1D:
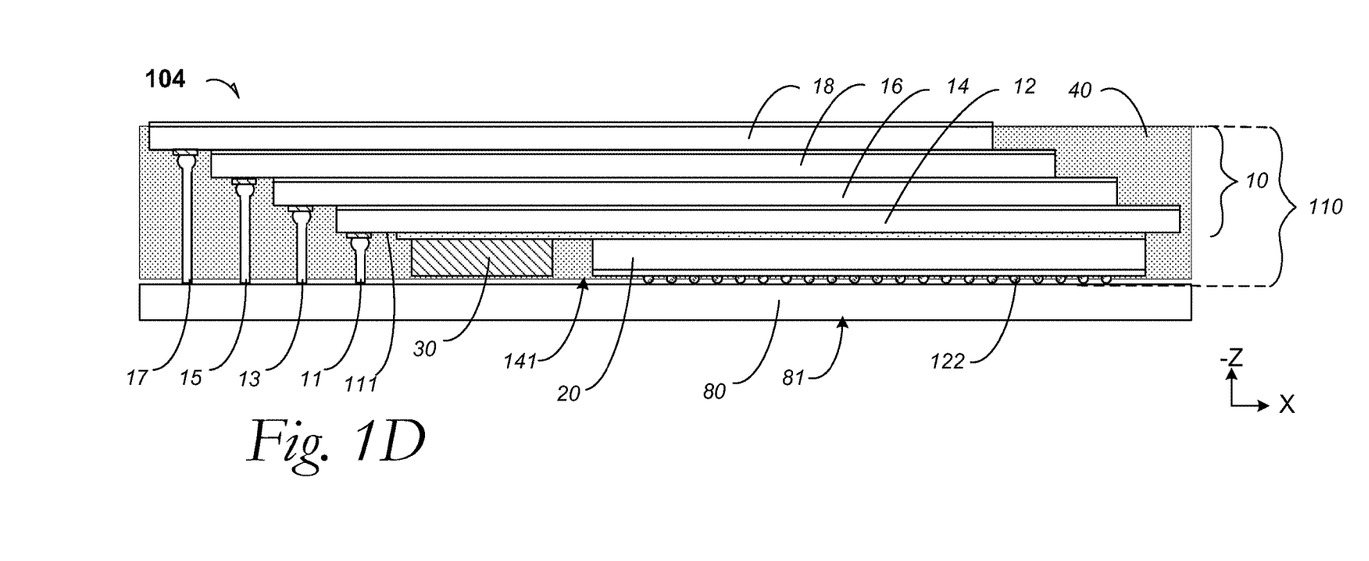
FIG. 1D is a cross-section elevation of a board-mounted memory module as part of a system in package apparatus according to an embodiment.

Further processing may be understood by reference to FIGS. 1C and 1D. After achieving a structure with the matrix precursor 39 after being cured into a matrix 40 (see FIGS. 1C and 1D), the structures represented in FIGS. 1C and 1D can be achieved by grinding the matrix precursor 39 and eventually approaching exposure of a bump array 122 (FIG. 1C) as well as vertical portions of the bond wires 11, 13, 15 and 17.

Also by grinding to this extent, the formerly loop-anchored wires 11, 13, 15 and 17 depicted in FIG. 1B are reduced in size to approach the vertical wires 11, 13, 15 and 17 depicted in FIGS. 1C and 1D. Because of useful rigidity of the matrix 40 and as the loop-anchored bond wires are reduced to vertical bond wires, the matrix 40 holds the bond wires in place and resists the vertical portions from deflecting.

In an embodiment as grinding of the matrix precursor 39 (FIG. 1B) approaches a useful endpoint, removing more matrix 40 is done by chemical etching. In an embodiment, the chemical etching is done by chemical-mechanical polishing (CMP) where etch solvents are selective to leaving metallic materials such as the bump array 122 and the terminal ends of the vertical bond wires 11, 13, 15 and 17 such that both the bumps of the bump array 122 and the terminal ends of the vertical bond wires 11, 13, 15 and 17 protrude from the matrix 40 as illustrated in FIGS. 1C and 1D. In an embodiment, etching is done following grinding. In an embodiment, etching is done alone without mechanical polishing.

FIG. 1C is a cross-section elevation 103 of memory module 110 that is part of a system in package (SiP) apparatus that uses vertical bond wire technology that includes a processor die 20 according to an embodiment. The first memory die 12 includes an active surface 111 and a backside surface (not indicated) that is covered with an adhesive first film 113. The active surface 111 includes both semiconductive structures and metallization. The first memory die 12 is fixed in the matrix 40 such as a molding material, and a first die vertical bond wire 11 contacts the active surface 111 and protrudes through the matrix 40 at a landing surface 141 for the memory module 110. The landing surface 141 is thus designated as the memory module 110 will be assembled onto a structure at that surface. In an embodiment, the first die vertical bond wire 11 extends orthogonal from the active surface 111 of the first memory die 12. By "orthogonal" it is meant the bond wire 11 visually appears to be extending uniformly and directly at a right angle away from the active surface 111 of the first memory die 12 to the terminal end of the bond wire 11. In an embodiment, "orthogonal" is quantified by observing the terminal end of the bond wire 11 protrudes above the landing surface 141 of the matrix 40, and the protruding end of the bond wire 11 has not deflected within the matrix 40 to either side in the X-direction more than the stair edge 1 of the first memory die 12 or more than the equivalent distance from the bond wire 11 away from the stair edge 1. This definition also applies to equivalent distance limitations in the Y-direction. In an embodiment, "orthogonal" is quantified by observing the terminal end of the vertical bond wire 11 has not deflected within the matrix 40 to either side in the X-direction of the bond pad edge 2 to which the vertical bond wire 11 is bonded. This definition also applies to equivalent distance limitations in the Y-direction.

The matrix 40 may also be referred to as a package material 40 according to an embodiment. The matrix 40 may also be referred to as an encapsulation molding compound (EMC) 40 according to an embodiment. Various organic package materials may be used for the matrix 40. Various EMC materials may be used for the matrix 40.

In an embodiment, the memory module 110 includes the first memory die 12 (which is part of a stair-stacked memory-die stack 10) stacked against the processor first die 20 at the active surface 111 by the adhesive processor-die film 123. The memory-die stack 10 and the processor first die 20 are seated in the matrix 40, but processing may result in a molding compound being flowed over and around the memory-die stack 10 such that it may also be termed affixed in the matrix 40.

In an embodiment, the processor first die 20 is a processor die such as that made by Intel Corporation of Santa Clara, Calif. The processor first die 20 includes an active surface 121 and a backside surface that is covered by the adhesive processor-die film 123. The active surface 121 has both semiconductive structures as well as metallization that leads to a processor bump array 122. The processor first die 20 is also seated in the matrix 40, but processing may result in a molding compound being flowed over and around the processor first die 20 such that it may also be termed affixed in the matrix 40. In an embodiment, the processor first die 20 is an ASIC such as for a memory controller hub. In an embodiment, the processor first die 20 includes ASIC such as for a memory controller hub, but it also includes additional microelectronic device capability such as core processing as well as cache functionality such as level-zero (L0) and L1 caches.

In an embodiment, the memory module 110 includes four stacked memory dice including the first memory die 12, the second memory die 14, the third memory die 16, and the fourth memory die 18. Where the second memory die 14 is the last die in the memory-die stack 10, it may also be referred to as a subsequent memory die 14. Similarly, where the third memory die 16 is the last die in the memory-die stack 10, it may also be referred to as a subsequent memory die 16. By the same token, where the fourth memory die 18 is the last die in the memory-die stack 10, it may also be referred to as a subsequent memory die 18. It is now understood that more than four memory dice may be stair-stacked such as eight memory dice with first-through-seventh memory dice and a subsequent memory die according to an embodiment. Hereinafter, description of memory-die stack 10 depicted in FIG. 1A will refer to the memory first- second- third- and dice 12, 14, 16 and 18, respectively. It may now be understood that more than four stair-stacked memory dice may be used.

In an embodiment, the processor first die 20 is configured adjacent the spacer 30, which has a similar vertical dimension, under useful package-assembly parameters, to the processor first die 20. Adjustment of the vertical height of the spacer 30 may be made by a spacer adjustor 31 such as an adhesive as depicted in FIG. 1A. In an embodiment, the processor first die 20 and the spacer 30 are also seated in the matrix 40.

FIG. 1D is a cross-section elevation 104 of a board-mounted memory module 110 as part of a system in package apparatus according to an embodiment. The structure 103, taken from FIG. 1C, has been rotated 180° and been assembled to item 80. A board 80 such as a motherboard has been electrically and physically mated to memory module 110. The vertical bond wires 11, 13, 15 and 17 extend orthogonally toward and are coupled to the board 80 and the processor bump array 122 is also coupled to the board 80. In an embodiment, the board 80 is a motherboard of a computing system. In an embodiment, the board 80 includes a redistribution layer (not detailed) that interfaces with the processor bump array 122 and the vertical bond wires 11, 13, 15 and 17. In an embodiment, the board 80 includes a redistribution layer that interfaces with the processor bump array 122 and the vertical bond wires 11, 13, 15 and 17, and the board 80 also includes the outer shell 81 of a computing system such as a mobile computing device. Where the board 80 includes an outer shell embodiment, the outer shell 81 is sufficiently electrically insulated from the traces and other devices both in and on the board 80.

Figure 2C:
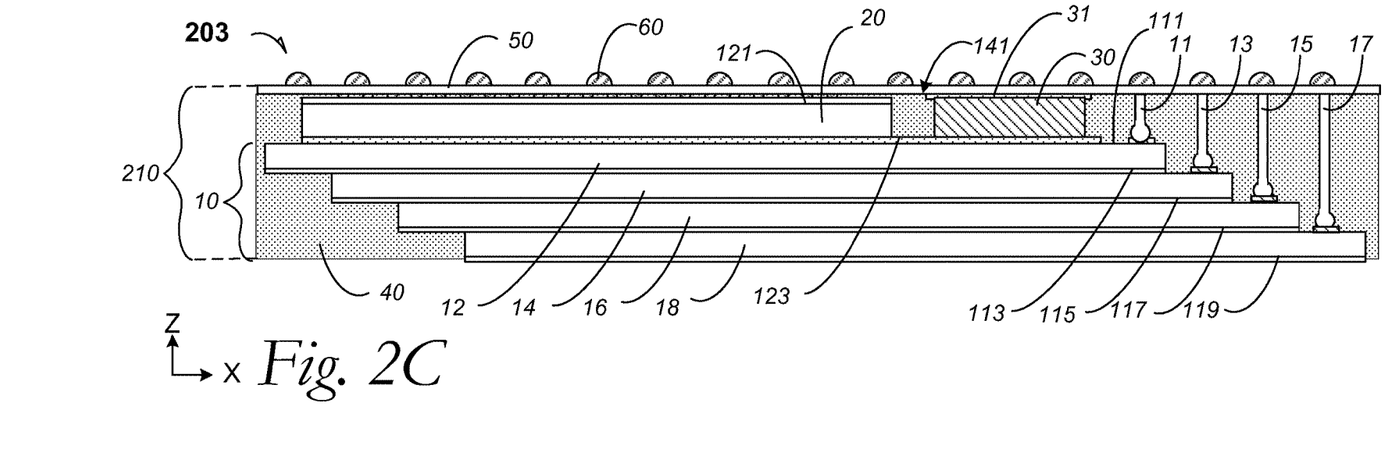
FIG. 2C is a cross-section elevation of a system in package of a memory-die stack as part of a memory module mounted with a redistribution layer where the memory module includes orthogonal bond wire technology according to an embodiment.

FIG. 2C is a cross-section elevation of a system in package (SiP) 203 of a memory-die stack 10 as part of a memory module 210 where the memory-die stack 10 includes vertical bond wire technology according to an embodiment. Items 2A and 2B are not used. The structure 203 is depicted after further processing of the article depicted in FIG. 1B according to an embodiment. This SiP 203 is similar to the SiP 103 depicted in FIG. 1C with additional structure of a redistribution layer (RDL) 50 that has been assembled at the landing surface 141, and a land ball grid array 60 is coupled to the RDL 50.

The SiP 203 is configured with the RDL 50 and ball-grid array 60 to couple to a board such as a motherboard of a computing system. Adjustment of the vertical height of the spacer 30 may be made by a spacer adjustor 31 such as an adhesive.

Figure 2D:
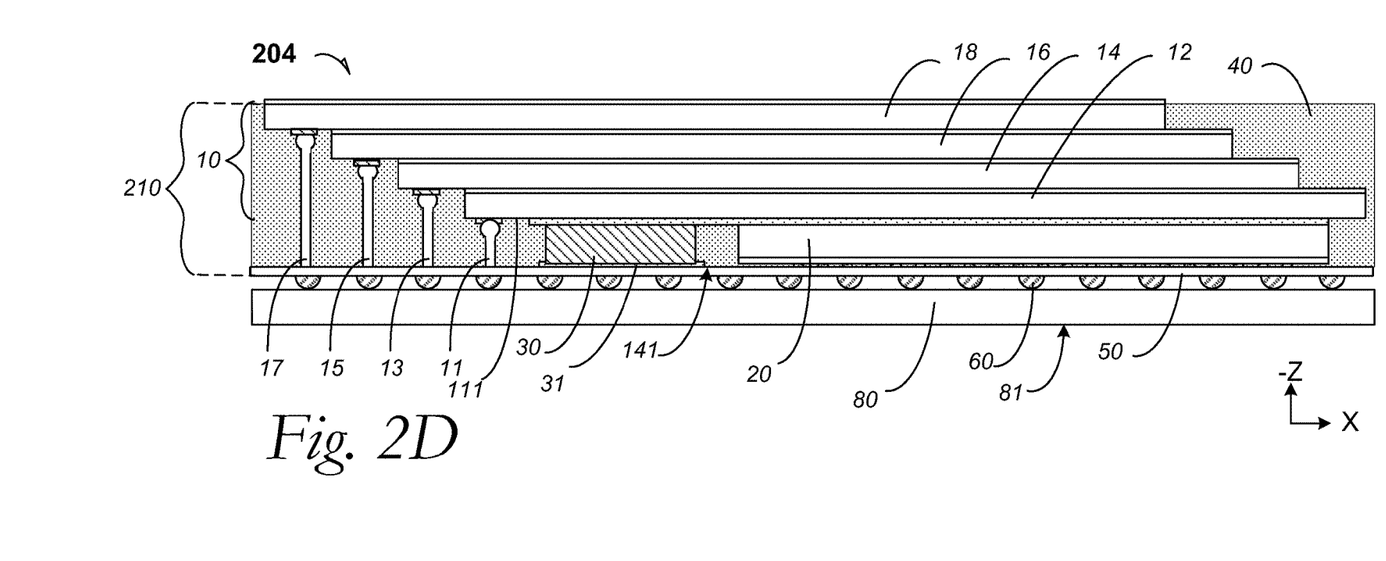
FIG. 2D is a cross-section elevation of a board-mounted memory module mounted with a redistribution layer in a system in package according to an embodiment.

FIG. 2D is a cross-section elevation 204 of a board-mounted memory module 210 in a system in package according to an embodiment. The structure 204 is taken from FIG. 2C has been rotated 180° and has been assembled to item 80. A board 80 such as a motherboard has been electrically and physically mated to the memory module 210 through the RDL 50. The vertical bond wires 11, 13, 15 and 17 extend orthogonally toward- and are coupled to the board 80 through the RDL 50 and a processor bump array 122 is also coupled to the board 80 through the RDL 50. In an embodiment, the board 80 is a motherboard of a computing system. In an embodiment, the board 80 also includes the outer shell 81 of a computing system such as a mobile computing device.

By comparison between some embodiments illustrated in FIG. 1C and some embodiments illustrated in FIG. 2C, whereas the structure 103 in FIG. 1C may be considered a "flip package" similar to a flip chip where it may be mounted directly onto a board, the structure 203 in FIG. 2C may be considered a "flip package" with additional structure of an RDL 50 and optionally a ball-grid array 60, that may be shipped between economic entities for installation into a computing system.

In an embodiment, testing of the assembled memory modules as depicted in FIG. 1C where bumps 122 and vertical bond wires 11, 13, 15 and 17 are exposed. Since a useful number- and type of bumps 122 and vertical bond wires 11, 13, 15 and 17 are exposed, testing can be carried out on all of the illustrated devices including the processor first die 20 and the several stacked memory dice 12, 14, 16 and 18. Testing methods may include placing an individual probe onto a selected bump in the bump array 122, as well as placing an individual probe onto a selected vertical bond wire from any of the vertical bond wires 11, 13, 15 and 17 as they are exposed at their terminal ends above the landing surface 141.

After testing is completed and a useful yield has been confirmed, an RDL 50 (see FIG. 2C) may be fabricated to couple the processor 20 with the dice in the memory-die stack 10.

Figure 3:
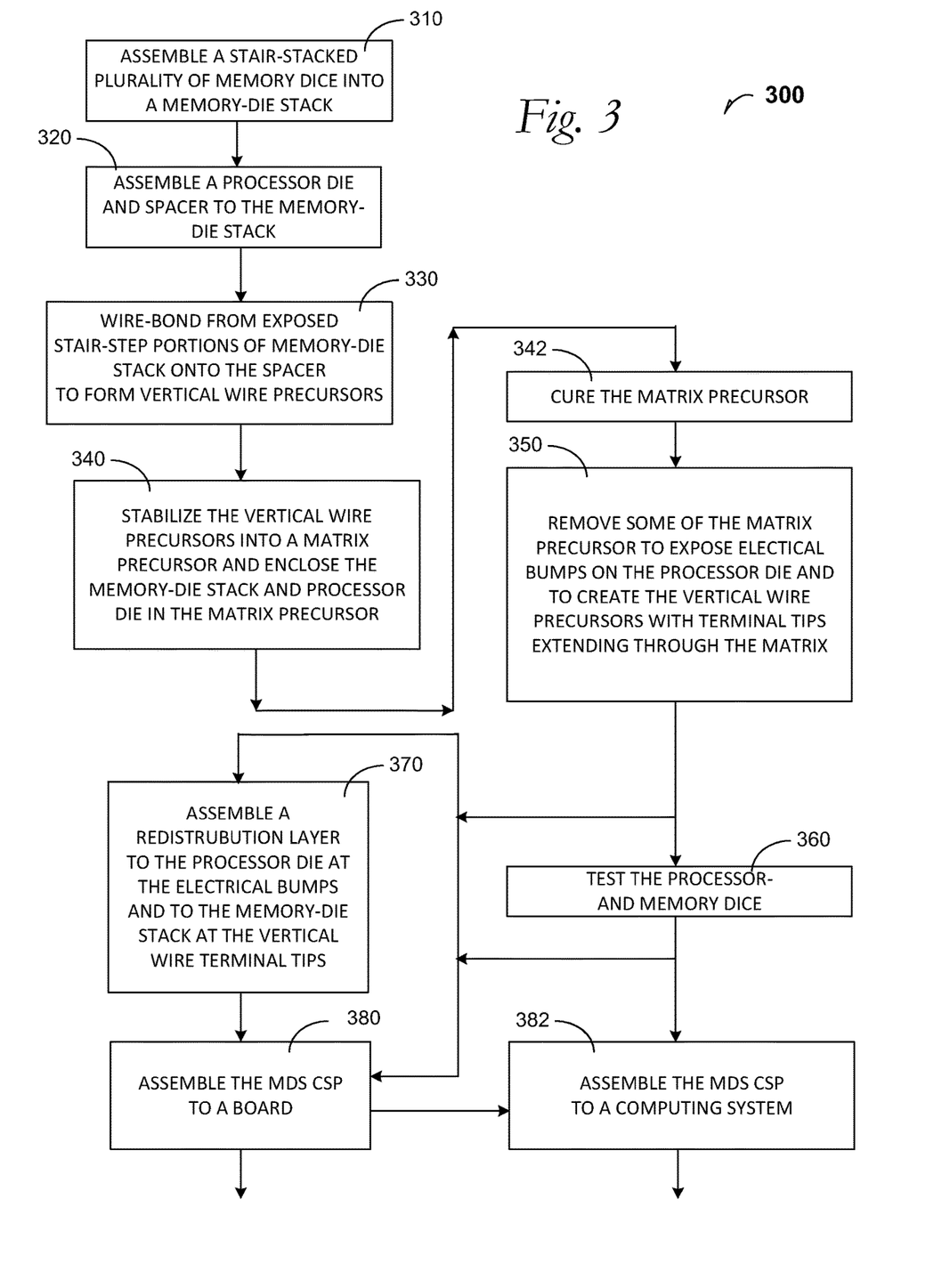
FIG. 3 is a process flow diagram that illustrates processing embodiments.

FIG. 3 is a process flow diagram 300 that illustrates processing embodiments.

At 310, the process includes assembling a stair-step plurality of memory dice into a memory-die stack. In a non-limiting example embodiment, the memory-die stack 10 depicted in FIG. 1 is assembled.

At 320, the process includes assembling the memory-die stack a to processor die and a spacer. In a non-limiting example embodiment, the adhesive processor-die film 123 depicted in FIG. 1A, is used to assemble the memory-die stack 10 to the processor first die 20 and to the spacer 30.

At 330, the process includes loop-bonding the vertical bond wire precursors between respective first-to-subsequent memory dice and onto the dummy layer. In a non-limiting example embodiment, the looped wirebonding depicted in FIG. 1A is accomplished between the first-through subsequent memory dice 12 through 18 and the spacer 30.

At 340, the process includes stabilizing the vertical bond wire precursors into a matrix precursor, and enclosing the memory-die stack and the processor die in the matrix precursor. In a non-limiting example embodiment, the matrix precursor 39 is injection molded over the pertinent structures as depicted in FIG. 1B.

At 342, the process includes curing the matrix precursor. In a non-limiting example embodiment, the matrix precursor 39 is thermally cured such as is useful for a dielectric epoxy material. In a non-limiting example embodiment, the matrix precursor 39 is thermal- and light cured where a useful spectrum of light energy cures and cross-links organic materials.

At 350, the process includes removing some of the matrix precursor such as by grinding sufficient of the cured matrix to expose the electrical bumps on the processor first die and to achieve vertical bond wires in the matrix.

At 360, a method embodiment includes testing the processor- and memory dice. In a non-limiting example embodiment, testing of the assembled SiP depicted in FIG. 1C may be done where bumps 122 and vertical bond wires 11, 13, 15 and 17 are exposed.

At 370, the process includes assembling a redistribution layer to the processor die at the electrical bumps and to the memory-die stack at the vertical bond wire terminal tips.

At 380, the process includes assembling the memory module SiP to a board. In a non-limiting example embodiment, the memory module SiP 103 is assembled to a board 80 such as a motherboard. In a non-limiting example embodiment, the memory module SiP 203 is assembled to a board 80 such as a motherboard. It can be seen that the SiP may be assembled to a board without the use of an RDL (see, e.g., FIG. 1D).

At 392, the process includes assembling the SiP to a computing system. In a non-limiting example embodiment, the SiP 104 is assembled to a board such as a motherboard and then to a computing system such as that depicted and described in FIG. 1D. In a non-limiting example embodiment, the SiP 204 is assembled to a board such as a motherboard and then to a computing system such as that depicted and described in FIG. 2D.

Figure 4:
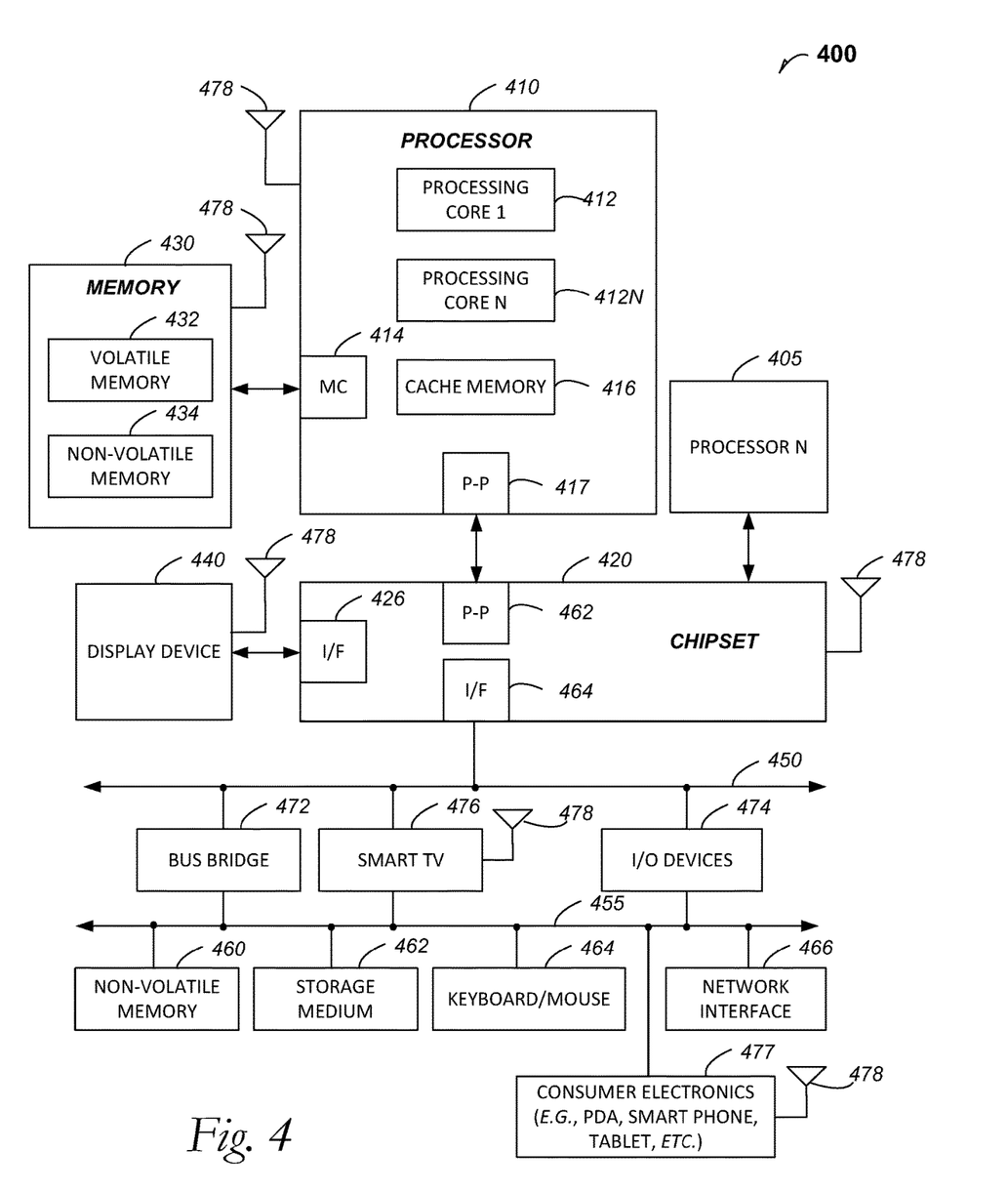
FIG. 4 is included to show an example of a higher level device application for the disclosed embodiments.

FIG. 4 is included to show an example of a higher level device application for the disclosed embodiments. In an embodiment, a system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, the system-in-package apparatus with a memory-die stack in a memory module embodiment 400 is a system on a chip (SOC) system.

In an embodiment, the processor 410 has one or more processing cores 412 and 412N, where 412N represents the Nth processor core inside processor 410 where N is a positive integer. In an embodiment, the electronic device system 400 using a system-in-package apparatus with a memory-die stack in a memory module embodiment that includes multiple processors including 410 and 405, where the processor 405 has logic similar or identical to the logic of the processor 410. In an embodiment, the processing core 412 includes, but is not limited to, pre-fetch logic to fetch instructions, decode logic to decode the instructions, execution logic to execute instructions and the like. In an embodiment, the processor 410 has a cache memory 416 to cache at least one of instructions and data for the SiP device system 400. The cache memory 416 may be organized into a hierarchal structure including one or more levels of cache memory.

In an embodiment, the processor 410 includes a memory controller 414, which is operable to perform functions that enable the processor 410 to access and communicate with memory 430 that includes at least one of a volatile memory 432 and a non-volatile memory 434. In an embodiment, the processor 410 is coupled with memory 430 and chipset 420. The processor 410 may also be coupled to a wireless antenna 478 to communicate with any device configured to at least one of transmit and receive wireless signals. In an embodiment, the wireless antenna interface 478 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, flash memory, phase change memory (PCM), read-only memory (ROM), electrically erasable programmable read-only memory (EEPROM), or any other type of non-volatile memory device.

The memory 430 stores information and instructions to be executed by the processor 410. In an embodiment, the memory 430 may also store temporary variables or other intermediate information while the processor 410 is executing instructions. In the illustrated embodiment, the chipset 420 connects with processor 410 via Point-to-Point (PtP or P-P) interfaces 417 and 422. Either of these PtP embodiments may be achieved using a system-in-package apparatus with a memory-die stack in a memory module embodiment as set forth in this disclosure. The chipset 420 enables the processor 410 to connect to other elements in the SiP device system 400. In an embodiment, interfaces 417 and 422 operate in accordance with a PtP communication protocol such as the Intel® QuickPath Interconnect (QPI) or the like. In other embodiments, a different interconnect may be used.

In an embodiment, the chipset 420 is operable to communicate with the processor 410, 405N, the display device 440, and other devices 472, 476, 474, 460, 462, 464, 466, 477, etc. The chipset 420 may also be coupled to a wireless antenna 478 to communicate with any device configured to at least do one of transmit and receive wireless signals.

The chipset 420 connects to the display device 440 via the interface 426. The display 440 may be, for example, a liquid crystal display (LCD), a plasma display, cathode ray tube (CRT) display, or any other form of visual display device. In and embodiment, the processor 410 and the chipset 420 are merged into a single SOC. Additionally, the chipset 420 connects to one or more buses 450 and 455 that interconnect various elements 474, 460, 462, 464, and 466. Buses 450 and 455 may be interconnected together via a bus bridge 472. In an embodiment, the chipset 420 couples with a non-volatile memory 460, a mass storage device(s) 462, a keyboard/mouse 464, and a network interface 466 by way of at least one of the interface 424 and 474, the smart TV 476, and the consumer electronics 477, etc.

In and embodiment, the mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the SiP apparatus in a computing system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into the processor core 412. Where useful, the computing system 400 may have an outer shell that is part of the several land side board embodiments described in this disclosure. For example, the land side board 140 depicted in FIG. 1, has an outer surface 142 that is sufficiently insulated that it may act as an outer shell of the computing system 400 depicted in FIG. 4. This embodiment may be seen in each of the cross-section elevations including an outer surface 642 for the system-in-package apparatus with a memory-die stack in a memory module embodiment depicted in FIGS. 1C and 2C.

Figure 5C:
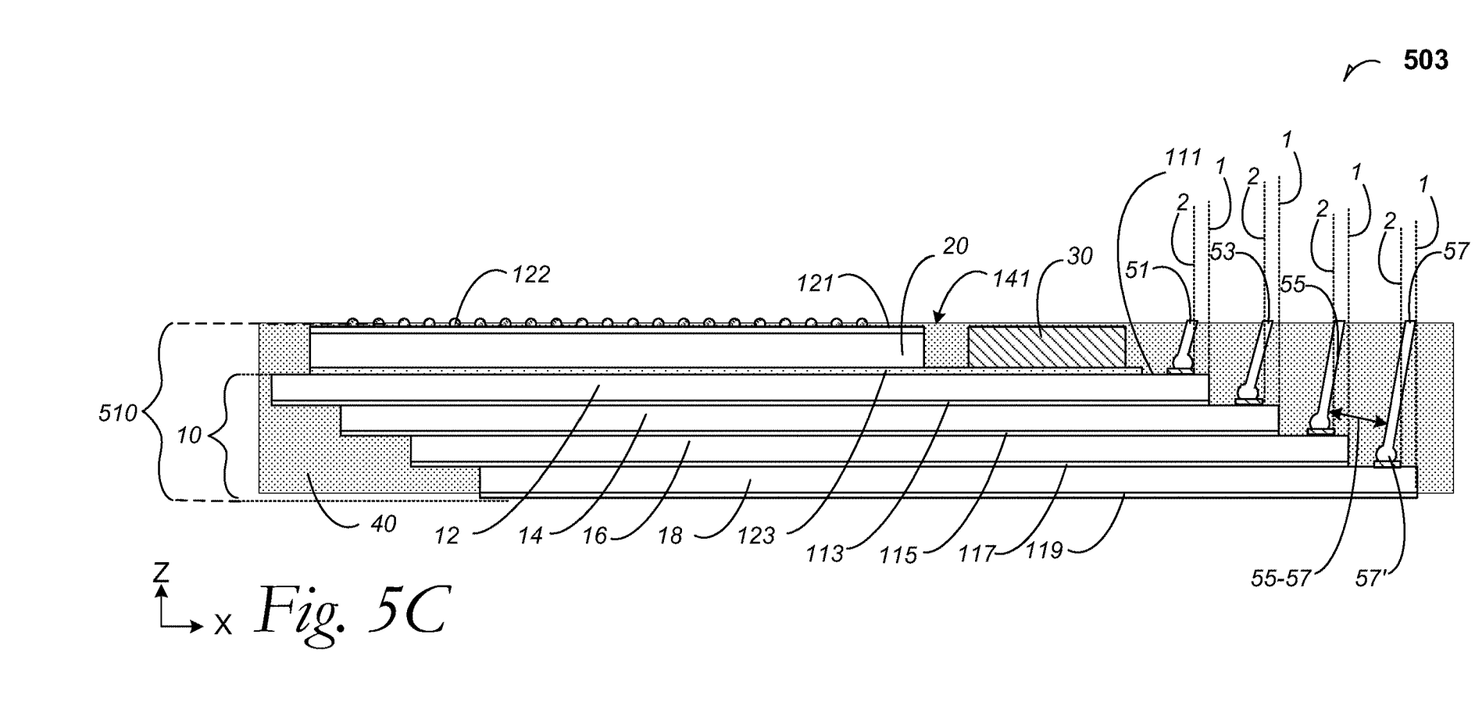
FIG. 5C is a cross-section elevation of a memory module that is part of a system in package apparatus that uses vertical bond wire technology that includes a processor die according to an embodiment.

FIG. 5C is a cross-section elevation 503 of memory module 510 that is part of a system in package (SiP) apparatus that uses vertical bond wire technology that includes a processor die 20 according to an embodiment. During process of embodiments depicted and described in FIG. 5C, processing may be similar to what is illustrated for apparatus being processed from FIGS. 1A and 1B. A difference for FIG. 5C embodiments includes forming the bond wired vertically but not orthogonally. In an embodiment, pinning out the vertical bond wires may be useful at a location other than directly orthogonally from the originating bond pads from the plurality dice in the memory-die stack.

The first memory die 12 includes an active surface 111 and a backside surface (not indicated) that is covered with an adhesive first film 113. The active surface 111 includes both semiconductive structures and metallization. The first memory die 12 is fixed in the matrix 40 such as a molding material, and a first die vertical (but not orthogonal) bond wire 51 contacts the active surface 111 and protrudes through the matrix 40 at a landing surface 141 for the memory module 110. The landing surface 141 is thus designated as the memory module 110 will be assembled onto a structure at that surface. The first die vertical bond wire 51 extends vertically from the active surface 111 of the first memory die 12. By "vertical" it is meant the bond wire 51 visually appears to be linearly extending uniformly and directly away from the active surface 111 of the first memory die 12 to the terminal end of the bond wire 51, but not orthogonally.

In an embodiment, "vertically, but not orthogonally" is qualified by observing the terminal end of the bond wire 51 protrudes above the landing surface 141 of the matrix 40, and the protruding end of the bond wire 51, has deflected within the matrix 40 to either side in the X-direction. The degree of deflection can be quantified the protruding end is deflected more than at least one of the stair edge 1 or the bond pad edge 2 of the first memory die. It can be seen this definition is dependent upon the relative lengths of any of the bond wires 51, 53, 55 and 57, and whereas the bond wire 51 may only deflect more than the bond pad edge 2 as it breaches the landing surface 141, the remaining bond wires may deflect and intersect both edges 1 and 2.

Collectively in an embodiment, a plurality of vertical bond wires is substantially co-parallel as each originates from its respective bond pads and terminates where it breaches the landing surface 141. In an embodiment, "co-parallel" is quantified by constraining each vertical bond wire in a projected corridor along the trajectory of the bond wire 57, spaced apart from a right-angle distance 55-57 that can be measured between two adjacent bond wires, e.g., 55 and 57, and the distance 55-57 is taken where a bond wire 57 emerges from the bond-wire bead 57'. The distance 55-57 does not vary more than twice the X-dimension width of a bond-wire bead 57' to where the bond wire breaches the landing surface 141. Consequently, each vertical bond wire when compared to e.g., and adjacent bond wire, remains within the projected corridor measured by the distance 55-57, plus twice the bond-wire bead width 57'.

It can now be understood that permutations of orthogonal and non-orthogonal bond wires may be in a single package. For example, orthogonal bond wires 11 and 13 as depicted in FIG. 1C, could be combined with vertical bond wires 55 and 57 as depicted in FIG. 5C. Such a varied bond-wire scheme accommodates constrained pin-out requirements in an embodiment. Such a varied bond-wire scheme accommodates diverse dice such as where first—and second dice 12 and 14 are similar to each other, but they differ from the third- and subsequent dice 16 and 18 and where third- and subsequent dice 16 and 18 are similar to each other in an embodiment. It may also now be understood that the memory module 503 depicted in FIG. 5C, may be mounted with a distribution layer such as the distribution layer 50 depicted in FIG. 2C.

In an embodiment, the processor first die 20 is a processor die such as that made by Intel Corporation of Santa Clara, Calif. The processor first die 20 includes an active surface 121 and a backside surface that is covered by the adhesive processor-die film 123. The active surface 121 has both semiconductive structures as well as metallization that leads to a processor bump array 122. The processor first die 20 is also seated in the matrix 40, but processing may result in a molding compound being flowed over and around the processor first die 20 such that it may also be termed affixed in the matrix 40. In an embodiment, the processor first die 20 is an ASIC such as for a memory controller hub. In an embodiment, the processor first die 20 includes ASIC such as for a memory controller hub, but it also includes additional microelectronic device capability such as core processing as well as cache functionality such as level-zero (L0) and L1 caches.

In an embodiment, the memory module 110 includes four stacked memory dice including the first memory die 12, the second memory die 14, the third memory die 16, and the fourth memory die 18. Where the second memory die 14 is the last die in the memory-die stack 10, it may also be referred to as a subsequent memory die 14. Similarly, where the third memory die 16 is the last die in the memory-die stack 10, it may also be referred to as a subsequent memory die 16. By the same token, where the fourth memory die 18 is the last die in the memory-die stack 10, it may also be referred to as a subsequent memory die 18. It is now understood that more than four memory dice may be stair-stacked such as eight memory dice with first-through-seventh memory dice and a subsequent memory die according to an embodiment. Hereinafter, description of memory-die stack 10 depicted in FIG. 4C will refer to the first-second- third- and subsequent memory dice 12, 14, 16 and 18, respectively. It may now be understood that more than four stair-stacked memory dice may be used.

In an embodiment, the processor first die 20 is configured adjacent the spacer 30, which has a similar vertical dimension, under useful package-assembly parameters, to the processor first die 20. Adjustment of the vertical height of the spacer 30 may be made by a spacer adjustor 31 such as an adhesive as depicted in FIG. 1A. In an embodiment, the processor first die 20 and the spacer 30 are also seated in the matrix 40. In an embodiment, the processor first die 20 is serviced by the spacer 30 where the spacer 30 is a second die. In an embodiment, the processor first die 20 is accompanied by the spacer 30 where the spacer 30 is a passive device.

To illustrate the memory-die stacked memory module in a system in package apparatus embodiments and methods disclosed herein, a non-limiting list of examples is provided herein:

Example 1 is a memory module in a system in package apparatus comprising: a matrix including a landing surface; a memory-die stack configured in a stair-step relationship and seated in the matrix, the memory-die stack including a first memory die and a subsequent memory die, the first memory die including an active surface and a backside surface and the subsequent memory die including an active surface and a backside surface, wherein the first memory die includes an orthogonal first bond wire that extends from the first memory die active surface and breaches the matrix landing surface, and the subsequent memory die includes an orthogonal subsequent bond wire that extends from the subsequent memory die active surface and breaches the matrix landing surface; a processor first die disposed on the first memory die and at least partially seated in the matrix, the processor first die including an active surface and a backside surface, wherein a processor bump array is disposed on the first memory die active surface, and wherein the processor bump array extends at least partially away from the matrix landing surface; a spacer disposed on the first memory die, and wherein the spacer is disposed between the processor first die and the first memory die orthogonal first bond wire.

In Example 2, the subject matter of Example 1 optionally includes wherein the orthogonal first bond wire extends away from the first memory die active surface, and wherein the orthogonal subsequent bond wire extends away from the subsequent memory die active surface.

In Example 3, the subject matter of any one or more of Examples 1-2 optionally include a second memory die disposed on the first memory die active surface and between the first memory die and the subsequent memory die, and an orthogonal second bond wire disposed on the second memory die, wherein the orthogonal second bond wire extends away from the second memory die.

In Example 4, the subject matter of any one or more of Examples 1-3 optionally include a second memory die disposed on the first memory die active surface and between the first memory die and the subsequent memory die; and a third memory die disposed on the second memory die active surface and between the second memory die and the subsequent memory die.

In Example 5, the subject matter of any one or more of Examples 1-4 optionally include a second memory die disposed on the first memory die active surface and between the first memory die and the subsequent memory die; and a third memory die disposed on the second memory die active surface and between the second memory die and the subsequent memory die, and wherein the third memory die is disposed on the subsequent memory die.

In Example 6, the subject matter of any one or more of Examples 1-5 optionally include a redistribution layer that contacts the processor bump array and the first memory die orthogonal bond wire and the subsequent memory die orthogonal bond wire; and a ball-grid array disposed on the redistribution layer.

In Example 7, the subject matter of Example 6 optionally includes a second memory die disposed on the first memory die active surface and between the first memory die and the subsequent memory die.

In Example 8, the subject matter of any one or more of Examples 6-7 optionally include a second memory die disposed on the first memory die active surface and between the first memory die and the subsequent memory die; and a third memory die disposed on the second memory die active surface and between the second memory die and the subsequent memory die.

In Example 9, the subject matter of any one or more of Examples 1-8 optionally include wherein the processor first die includes memory controller hub function.

In Example 10, the subject matter of any one or more of Examples 1-9 optionally include wherein the spacer is a second die.

Example 11 is a memory module in a system in package apparatus comprising: a matrix including a landing surface; a memory-die stack configured in a stair-step relationship and seated in the matrix, the memory-die stack including a first memory die and a subsequent memory die, the first memory die including an active surface and a backside surface and the subsequent memory die including an active surface and a backside surface, wherein the first memory die includes a vertical first bond wire that extends at a non-orthogonal angle from the first memory die active surface and breaches the matrix landing surface, and the subsequent memory die includes a vertical subsequent bond wire that extends from the subsequent memory die active surface and breaches the matrix landing surface; a processor first die disposed on the first memory die and at least partially seated in the matrix, the processor first die including an active surface and a backside surface, wherein a processor bump array is disposed on the first memory die active surface, and wherein the processor bump array extends at least partially away from the matrix landing surface; a spacer disposed on the first memory die, and wherein the spacer is disposed between the processor first die and the first memory die vertical first bond wire.

In Example 12, the subject matter of Example 11 optionally includes wherein the vertical first bond wire extends away from the first memory die active surface, and wherein the vertical subsequent bond wire extends at a non-orthogonal angle away from the subsequent memory die active surface.

In Example 13, the subject matter of any one or more of Examples 11-12 optionally include wherein the vertical first bond wire extends away from the first memory die active surface, wherein the vertical subsequent bond wire extends at a non-orthogonal angle away from the subsequent memory die active surface; and wherein the vertical first bond wire and the vertical subsequent bond wire extend co-parallel from each respective first- and subsequent bond pad until each breaches the landing surface.

In Example 14, the subject matter of any one or more of Examples 11-13 optionally include a second memory die disposed on the first memory die active surface and between the first memory die and the subsequent memory die, and a vertical second bond wire disposed on the second memory die, wherein the vertical second bond wire extends at a non-orthogonal angle from the second memory die.

In Example 15, the subject matter of any one or more of Examples 11-14 optionally include a second memory die disposed on the first memory die active surface and between the first memory die and the subsequent memory die; and a third memory die disposed on the second memory die active surface and between the second memory die and the subsequent memory die.

Example 16 is a method of testing and assembling a memory module in a system in package apparatus, comprising: applying a test probe to a bump in a bump array of a processor first die that is seated in a matrix, the matrix including a landing surface, and the matrix also containing a memory-die stack in a stair-stacked configuration, the memory-die stack including a first memory die and a subsequent memory die; applying a test probe to an orthogonal first bond wire terminal end that extends above the matrix at the landing surface, wherein first memory die includes an active surface and a backside surface and the subsequent memory die including an active surface and a backside surface, wherein the first memory die includes the orthogonal first bond wire that extends from the first memory die active surface, and the subsequent memory die includes an orthogonal subsequent bond wire that extends from the subsequent memory die active surface and breaches the matrix landing surface.

In Example 17, the subject matter of Example 16 optionally includes wherein testing includes testing the first memory die, a second memory die, and the subsequent memory die, further including following achieving a testing yield: assembling a redistribution layer to the processor first die and the first memory die, the second memory die, and the subsequent memory die.

In Example 18, the subject matter of any one or more of Examples 16-17 optionally include wherein testing includes testing the first memory die, a second memory die, and the subsequent memory die, further including following achieving a testing yield: assembling a board to the processor first die and the first memory die, the second memory die, and the subsequent memory die.

Example 19 is a method of assembling a memory module in a system in package apparatus, comprising: assembling a memory-die stack in a stair-stacked configuration to a processor first die and a spacer; wirebonding a plurality of memory dice in the memory-die stack, wherein at least a one bond wire spans between the first memory die the spacer; with a matrix material precursor, overmolding the processor first die, the spacer, and the memory-die stack under conditions to partially encapsulate the bond wire; curing the matrix material; removing a portion of the matrix material under conditions to reduce the bond wire to an orthogonal bond wire and to expose an electrical bump that is part of a bump array on the processor first die, wherein removing a portion of the matrix also exposes a landing surface.

In Example 20, the subject matter of Example 19 optionally includes wherein the memory-die stack includes a first memory die with an active surface and a backside surface and a subsequent memory die including an active surface and a backside surface, wherein the first memory die includes the at least one bond wire that is configured as an orthogonal first bond wire, further including an orthogonal subsequent bond wire that extends from the subsequent memory die active surface, wherein removing a portion of the matrix includes first grinding the matrix followed by etching the matrix to arrive at a landing surface.

In Example 21, the subject matter of any one or more of Examples 19-20 optionally include wherein the memory-die stack includes a first memory die with an active surface and a backside surface and a subsequent memory die including an active surface and a backside surface, wherein the first memory die includes the at least one bond wire that is configured as an orthogonal first bond wire, further including an orthogonal subsequent bond wire that extends from the subsequent memory die active surface, wherein removing a portion of the matrix includes first grinding the matrix, followed by polishing the matrix, followed by etching the matrix to arrive at a landing surface.

In Example 22, the subject matter of any one or more of Examples 19-21 optionally include assembling a redistribution layer to contact the processor bump array and the first memory die orthogonal first bond wire and the subsequent memory die orthogonal subsequent bond wire; and assembling a ball-grid array on the redistribution layer.

In Example 23, the subject matter of Example 22 optionally includes assembling the redistribution layer to a board.

In Example 24, the subject matter of any one or more of Examples 19-23 optionally include assembling the orthogonal first bond wire, the orthogonal subsequent bond wire, and the bump array to a board.

Example 25 is a computing system including a memory-die stack in a memory module in a system in package apparatus comprising a board, and mounted on the board: a matrix including a landing surface; a memory-die stack configured in a stair-step relationship and seated in the matrix, the memory-die stack including a first memory die and a subsequent memory die, the first memory die including an active surface and a backside surface and the subsequent memory die including an active surface and a backside surface, wherein the first memory die includes an orthogonal first bond wire that extends from the first memory die active surface and breaches the matrix landing surface, and the subsequent memory die includes an orthogonal subsequent bond wire that extends from the subsequent memory die active surface and breaches the matrix landing surface; a processor first die disposed on the first memory die and at least partially seated in the matrix, the processor first die including an active surface and a backside surface, wherein a processor bump array is disposed on the processor first die active surface, and wherein the processor bump array extends at least partially away from the matrix landing surface; a spacer disposed on the first memory die, and wherein the spacer is disposed between the processor first die and the first memory die orthogonal first bond wire; and wherein the board includes an outer shell that electrically insulates the memory-die stack and the processor first die.

In Example 26, the subject matter of Example 25 optionally includes a redistribution layer that contacts the processor bump array and the first memory die orthogonal first bond wire and the subsequent memory die orthogonal subsequent bond wire; and a ball-grid array disposed on the redistribution layer, and wherein the redistribution layer is disposed between the processor first die, the spacer and the board.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory module in a system in package apparatus comprising:
   a matrix including a landing surface;
   a memory-die stack configured in a stair-step relationship and seated in the matrix, the memory-die stack including a first memory die and a subsequent memory die, the first memory die including an active surface and a backside surface and the subsequent memory die including an active surface and a backside surface, wherein the first memory die includes an orthogonal first bond wire that extends from the first memory die active surface and breaches the matrix landing surface, and the subsequent memory die includes an orthogonal subsequent bond wire that extends from the subsequent memory die active surface and breaches the matrix landing surface;
   a processor first die disposed on the first memory die and at least partially seated in the matrix, the processor first die including an active surface and a backside surface, wherein a processor bump array is disposed on the first memory die active surface, and wherein the processor bump array extends at least partially away from the matrix landing surface;
   a spacer, separate from the matrix, and disposed within the matrix, the spacer disposed on the first memory die, and wherein the spacer is disposed laterally between the processor first die and the first memory die orthogonal first bond wire.

2. The memory module in a system in package apparatus of claim 1, wherein the orthogonal first bond wire extends away from the first memory die active surface, and wherein the orthogonal subsequent bond wire extends away from the subsequent memory die active surface.

3. The memory module in a system in package apparatus of claim 1, further including a second memory die disposed on the first memory die active surface and between the first memory die and the subsequent memory die, and an orthogonal second bond wire disposed on the second memory die, wherein the orthogonal second bond wire extends away from the second memory die.

4. The memory module in a system in package apparatus of claim 1, further including:
   a second memory die disposed on the first memory die active surface and between the first memory die and the subsequent memory die; and
   a third memory die disposed on the second memory die active surface and between the second memory die and the subsequent memory die.

5. The memory module in a system in package apparatus of claim 1, further including:
   a second memory die disposed on the first memory die active surface and between the first memory die and the subsequent memory die; and
   a third memory die disposed on the second memory die active surface and between the second memory die and the subsequent memory die, and wherein the third memory die is disposed on the subsequent memory die.

6. The memory module in a system in package apparatus of claim 1, further comprising:
   a redistribution layer that contacts the processor bump array and the first memory die orthogonal bond wire and the subsequent memory die orthogonal bond wire; and
   a ball-grid array disposed on the redistribution layer.

7. The memory module in a system in package apparatus of claim 6, further including a second memory die disposed on the first memory die active surface and between the first memory die and the subsequent memory die.

8. The memory module in a system in package apparatus of claim 6, further including:
- a second memory die disposed on the first memory die active surface and between the first memory die and the subsequent memory die; and
- a third memory die disposed on the second memory die active surface and between the second memory die and the subsequent memory die.

9. The memory module in a system in package apparatus of claim 1, wherein the processor first die includes memory controller hub function.

10. The memory module in a system in package apparatus of claim 1, wherein the spacer is a second die.

11. A memory module in a system in package apparatus comprising:
- a matrix including a landing surface;
- a memory-die stack configured in a stair-step relationship and seated in the matrix, the memory-die stack including a first memory die and a subsequent memory die, the first memory die including an active surface and a backside surface and the subsequent memory die including an active surface and a backside surface, wherein the first memory die includes a vertical first bond wire that extends at a non-orthogonal angle from the first memory die active surface and breaches the matrix landing surface, and the subsequent memory die includes a vertical subsequent bond wire that extends from the subsequent memory die active surface and breaches the matrix landing surface;
- a processor first die disposed on the first memory die and at least partially seated in the matrix, the processor first die including an active surface and a backside surface, wherein a processor bump array is disposed on the first memory die active surface, and wherein the processor bump array extends at least partially away from the matrix landing surface;
- a spacer, separate from the matrix, and disposed within the matrix, the spacer disposed on the first memory die, and wherein the spacer is disposed laterally between the processor first die and the first memory die vertical first bond wire.

12. The memory module in a system in package apparatus of claim 11, wherein the vertical first bond wire extends away from the first memory die active surface, and wherein the vertical subsequent bond wire extends at a non-orthogonal angle away from the subsequent memory die active surface.

13. The memory module in a system in package apparatus of claim 11, wherein the vertical first bond wire extends away from the first memory die active surface, wherein the vertical subsequent bond wire extends at a non-orthogonal angle away from the subsequent memory die active surface; and wherein the vertical first bond wire and the vertical subsequent bond wire extend co-parallel from each respective first- and subsequent bond pad until each breaches the landing surface.

14. The memory module in a system in package apparatus of claim 11, further including a second memory die disposed on the first memory die active surface and between the first memory die and the subsequent memory die, and a vertical second bond wire disposed on the second memory die, wherein the vertical second bond wire extends at a non-orthogonal angle from the second memory die.

15. The memory module in a system in package apparatus of claim 11, further including:
- a second memory die disposed on the first memory die active surface and between the first memory die and the subsequent memory die; and
- a third memory die disposed on the second memory die active surface and between the second memory die and the subsequent memory die.

16. A computing system including a memory-die stack in a memory module in a system in package apparatus comprising a board, and mounted on the board:
- a matrix including a landing surface;
- a memory-die stack configured in a stair-step relationship and seated in the matrix, the memory-die stack including a first memory die and a subsequent memory die, the first memory die including an active surface and a backside surface and the subsequent memory die including an active surface and a backside surface, wherein the first memory die includes an orthogonal first bond wire that extends from the first memory die active surface and breaches the matrix landing surface, and the subsequent memory die includes an orthogonal subsequent bond wire that extends from the subsequent memory die active surface and breaches the matrix landing surface;
- a processor first die disposed on the first memory die and at least partially seated in the matrix, the processor first die including an active surface and a backside surface, wherein a processor bump array is disposed on the processor first die active surface, and wherein the processor bump array extends at least partially away from the matrix landing surface;
- a spacer, separate from the matrix, and disposed within the matrix, the spacer disposed on the first memory die, and wherein the spacer is disposed laterally between the processor first die and the first memory die orthogonal first bond wire; and
- wherein the board includes an outer shell that electrically insulates the memory-die stack and the processor first die.

17. The computing system of claim 16, further including:
- a redistribution layer that contacts the processor bump array and the first memory die orthogonal first bond wire and the subsequent memory die orthogonal subsequent bond wire; and
- a ball-grid array disposed on the redistribution layer, and wherein the redistribution layer is disposed between the processor first die, the spacer and the board.

* * * * *